(12) United States Patent
Marotta

(10) Patent No.: US 6,924,676 B2
(45) Date of Patent: Aug. 2, 2005

(54) CONDITIONED AND ROBUST ULTRA-LOW POWER POWER-ON RESET SEQUENCER FOR INTEGRATED CIRCUITS

(75) Inventor: Giulio Giuseppe Marotta, Contigliano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/229,920

(22) Filed: Aug. 28, 2002

(65) Prior Publication Data

US 2003/0058011 A1 Mar. 27, 2003

(30) Foreign Application Priority Data

Aug. 30, 2001 (IT) .................................. RM2001A0522

(51) Int. Cl.⁷ .................................................. H03L 7/00
(52) U.S. Cl. .................................... 327/143; 327/198
(58) Field of Search ............................... 327/143, 198

(56) References Cited

U.S. PATENT DOCUMENTS

| | | | |
|---|---|---|---|
| 4,385,243 A | 5/1983 | Suzuki | 327/143 |
| 4,428,022 A | 1/1984 | Engel | 361/96 |
| 4,539,489 A * | 9/1985 | Vaughn | 327/206 |
| 4,885,476 A | 12/1989 | Mahabadi | 327/143 |
| 5,180,926 A * | 1/1993 | Skripek | 327/143 |
| 5,686,847 A * | 11/1997 | Stubbe et al. | 327/143 |
| 5,767,710 A | 6/1998 | Cho | 327/143 |
| 5,801,561 A | 9/1998 | Wong | 327/143 |
| 6,016,068 A * | 1/2000 | Ding | 327/142 |
| 6,076,172 A * | 6/2000 | Kimura et al. | 714/24 |
| 6,077,717 A * | 6/2000 | McBride | 438/10 |
| 6,118,315 A * | 9/2000 | Guedj | 327/143 |
| 6,160,431 A | 12/2000 | Crotty | 327/143 |
| 6,204,703 B1 * | 3/2001 | Kwon | 327/143 |
| 6,259,286 B1 | 7/2001 | Papaliolios | 327/143 |
| 6,351,109 B1 | 2/2002 | Yoshida | 323/284 |
| 2001/0048328 A1 | 12/2001 | Sato | 327/143 |
| 2002/0011883 A1 * | 1/2002 | Yamazaki et al. | 327/143 |
| 2003/0020525 A1 | 1/2003 | Shigemasa | 327/143 |

* cited by examiner

*Primary Examiner*—Quan Tra
(74) *Attorney, Agent, or Firm*—Leffert Jay & Polglaze, P.A.

(57) ABSTRACT

A power-on reset (POR) circuit determines when integrated circuit voltages and/or currents have reached predetermined levels and provides trigger signals to control the POR transition of the integrated circuit.

31 Claims, 4 Drawing Sheets

CONDITIONED AND ROBUST ULTRA-LOW POWER POWER-ON RESET SEQUENCER FOR INTEGRATED CIRCUITS

RELATED APPLICATIONS

This application claims priority to Italian Patent Application Ser. No. RM2001A000522, filed Aug. 30, 2001, entitled "Conditioned and Robust Ultra-Low Power Power-On Reset Sequencer for Integrated Circuits."

TECHNICAL FIELD

The present invention relates generally to Power-On-Reset circuits, in particular, to Power-On-Reset circuits employed in flash memory integrated circuits where one or more power supplies must reach predetermined output levels before the POR circuit transitions.

BACKGROUND

Almost all integrated circuits (ICs), and, in particular, flash memory ICs, have an internal Power-On-Reset circuit (POR) to reset all circuits before the IC begins to operate. Traditional POR circuits can malfunction, however, and cause incorrect operation of the integrated circuit, if the reset operation is allowed to take place before voltage and current sources and signals of the integrated circuit have reached their nominal levels. In particular, internal power supplies generated by charge pumps need time to set their output voltages to the correct level. In addition, in the case of flash memories used in cellular phones and in other applications requiring very low power consumption, the POR must operate at values of Vcc as low as 1.65 V, and POR power consumption must be eliminated or at least minimized once the reset operation is completed. Moreover, the POR circuit must be robust enough to work properly regardless of the slope of the Vcc ramp.

For the reasons stated above and for additional reasons stated hereinafter, which will become apparent to those skilled in the art upon reading and understanding the present specification, there is a need in the art for a conditioned and robust ultra-low power power-on reset circuit for very low voltage flash memory.

SUMMARY

The above-mentioned problems with traditional POR circuits and other problems are addressed by the present invention, at least in part, and will be understood by reading and studying the following specification.

A POR sequencer circuit is disclosed. The POR sequencer circuit of the present invention includes a sensing circuit, a delay circuit and a switching circuit. The sensing circuit determines when circuit voltages and/or currents of an integrated circuit have reached predetermined levels and provides trigger signals. The delay circuit introduces a delay in at least one trigger signal to ensure that other circuit elements of the integrated circuit had have sufficient time to reach their nominal levels before a POR reset signal transition takes place. The switching circuit reads signals from the sensing circuitry and the delay circuit and generates a signal for operating a power-on reset signal.

In another embodiment a method for providing a power-on reset signal to a circuit includes sensing when circuit voltages and/or currents have reached predetermined levels and providing trigger signals. The invention further provides apparatus and methods of varying scope.

Although, various embodiments have been illustrated using particular electronic components it will be understood by those of ordinary skill in the art that other circuit elements could be implemented and that the present invention is not limited to the arrangement of circuit elements disclosed. Moreover, it will also be understood in the art that the present invention could be applied to a power-on reset circuit for devices other than flash memory or flash memory that operates on very low supply voltages. Therefore, the present invention is not limited to a POR circuit for very low voltage flash memory.

DETAILED DESCRIPTION

Figure 1:
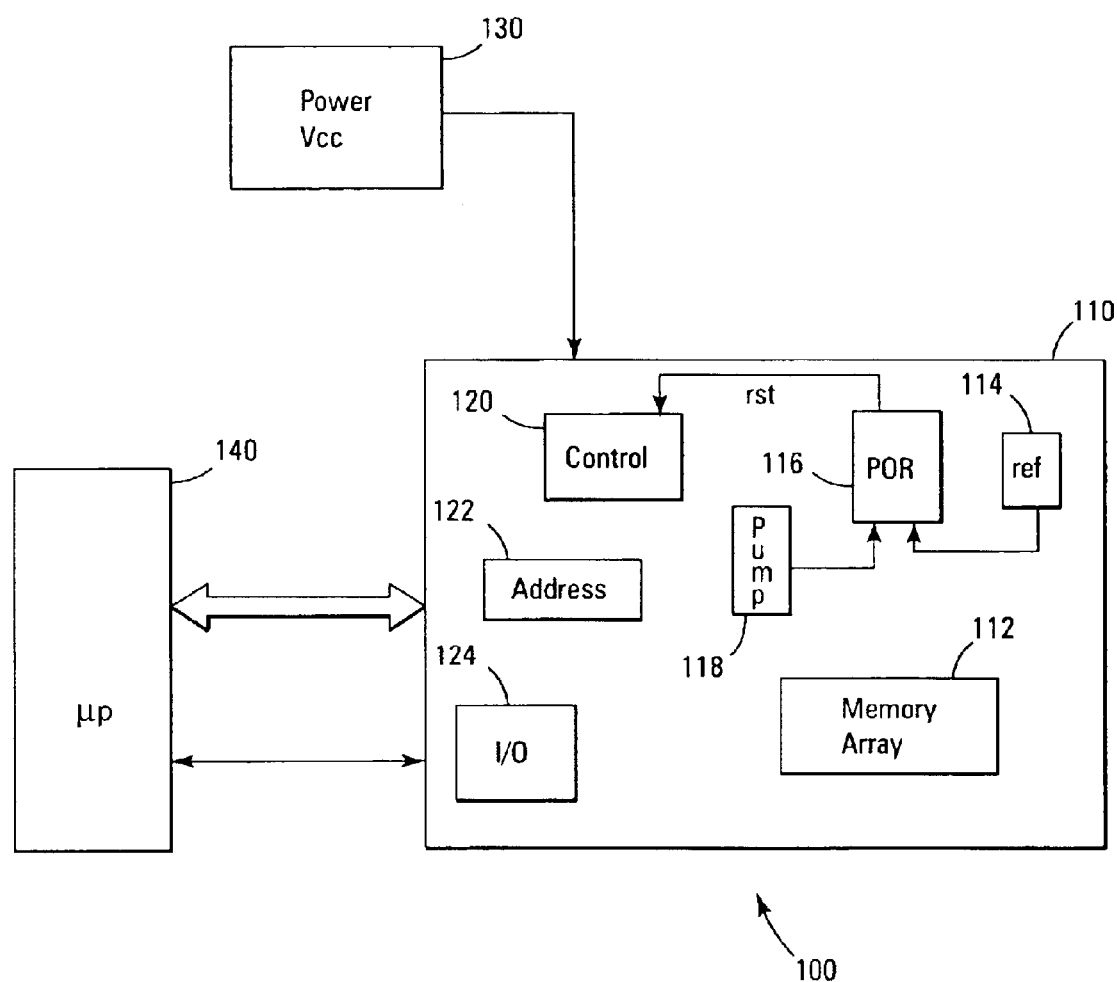
FIG. 1 is a block diagram of a memory circuit coupled to a processor and a voltage supply according to an embodiment of the invention.

FIG. 1 shows a computer system 100 including a memory circuit 110, a power supply 130 and a processor 140. Memory 110 includes a memory array 112 of nonvolatile memory cells (which can be flash memory cells), an on-chip reference voltage source 114, a power-on reset circuit 116, a pump 118 for providing elevated voltages for read, write and erase operations, and so forth, and a controller 120 that controls detailed operations of memory 110 such as the various individual steps necessary for carrying out writing, reading, and erasing operations. Memory 110 also includes an address decoder circuit 122 for decoding and selecting addresses provided by processor 140 to access appropriate memory cells in memory array 112, and an I/O circuit 124 for providing bi-directional communications between processor 140 and memory circuit 110.

In general, when the supply voltage, Vcc, starts to ramp toward its nominal value in a flash memory circuit, some signals remain at or near "0," while others follow the Vcc ramp. Although the nominal voltage for the logic "1" level is not yet reached, such signals may be considered to have reached a logic "1" during the ramp up. The reset signal, rst, inherently follows Vcc thereby resetting the memory during the Vcc ramp up. One purpose of the present invention is to transition the rst signal from "1" to "0," ending the reset of the whole flash memory, or other integrated circuit, only after other signals such as Vcc and vread are properly set for correct memory operation.

Figure 2:
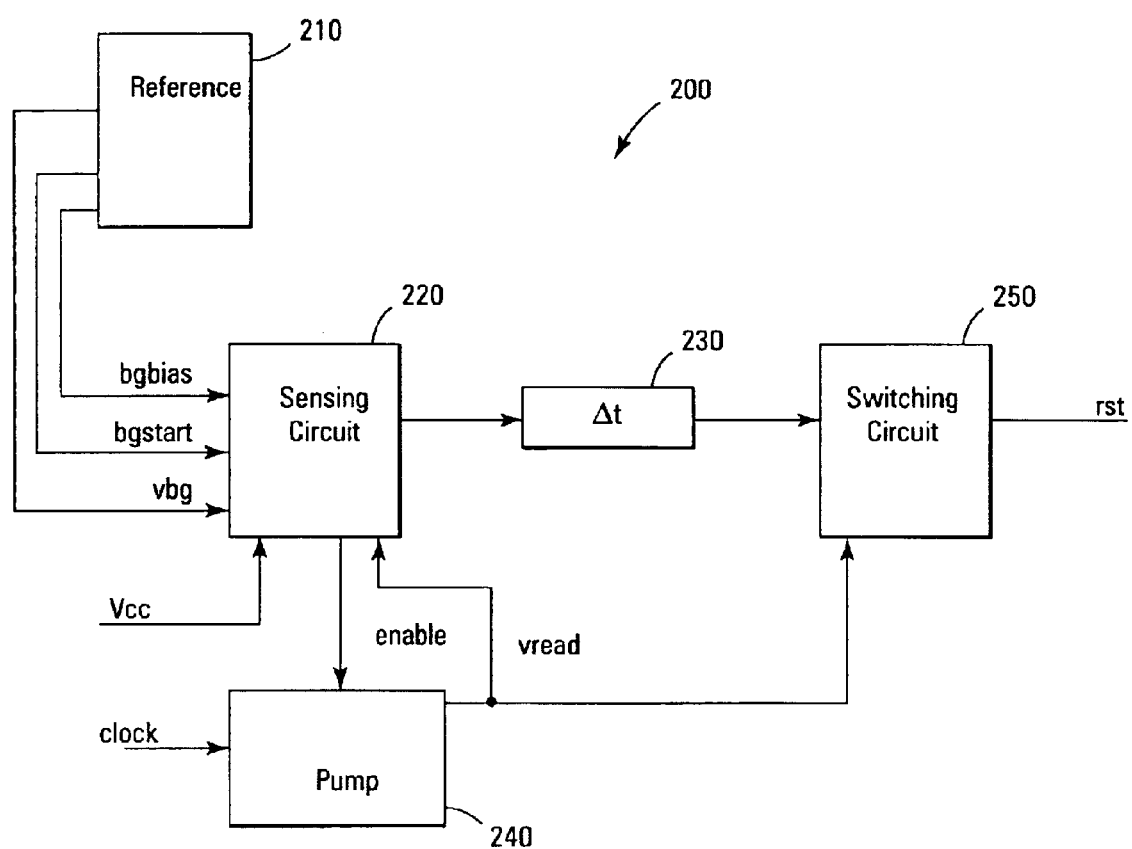
FIG. 2 is a simplified block diagram of a POR reset sequencer circuit according to an embodiment of the invention.

Referring to FIG. 2, a simplified functional block diagram of one embodiment of the present invention is described. The POR reset circuit 200 includes voltage reference 210, sensing circuit 220, delay circuit 230, pump 240 and switching circuit 250. Voltage reference 210 may be a low voltage flash memory voltage reference or other voltage reference in use in many integrated circuits. Sensing circuit 220 senses when reference voltages have reached certain predetermined values. Delay circuit 230 introduces a delay in signal output from the sensing circuit to provide time for internal and external power supply voltages to reach their nominal values. Pump 240 generates a vread signal used to read memory elements. Switching circuit 250 outputs a rst signal in response to signals from sensing circuit 220, delay circuit 230 and pump 240.

In general, a POR circuit according to the present invention operates as follows. The rst signal is allowed to transition from "1" to "0" only after several events have occurred: sensing circuit 220 has determined that voltages from voltage reference 210 have turned on or reached certain values, pump 240 has output vread after being enabled by a signal from sensing circuit 220, vread has reached a predetermined value, the delay of delay circuit 230 has elapsed providing a delayed activation signal to switching circuit 250 and Vcc has reached a certain predetermined value. After rst transitions, power consuming elements of switching circuit 250 automatically switch off to minimize current consumption of the POR reset circuit when it is not in operation.

Figure 3:
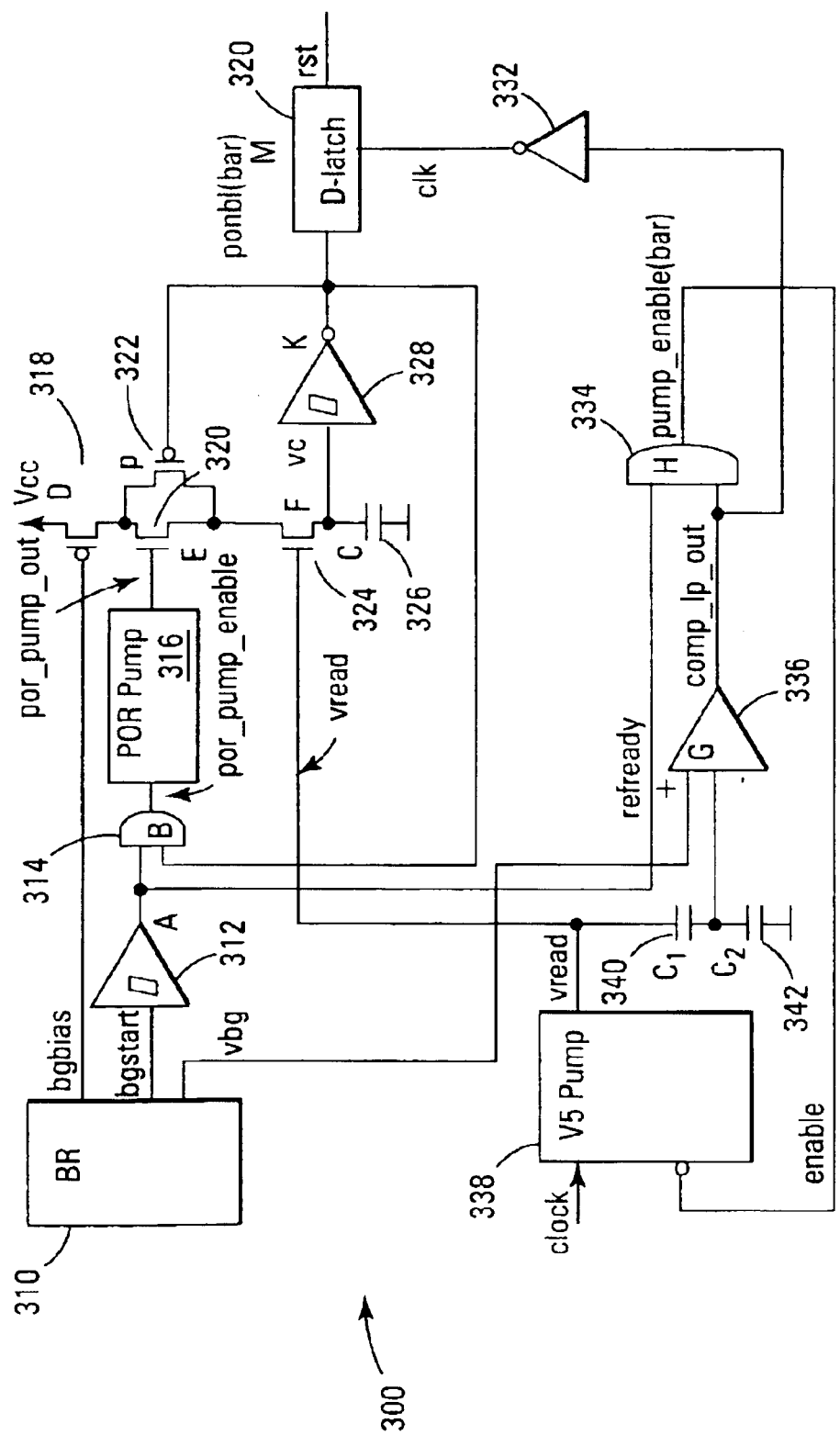
FIG. 3 is a more detailed block diagram of a POR circuit according to an embodiment of the invention.

Referring to FIG. 3, a more detailed block diagram of one embodiment of the present invention is described. The POR reset circuit 300 includes bandgap Reference (BR) block 310, which is a standard component in flash memory circuits. BR block 310 generates three signals used in the present invention. The first signal is bandgap reference voltage vbg which, in general, is also used as a reference voltage in other parts of the flash memory. BR block 310 also generates bgstart. At power up, bgstart rises following ramp up of Vcc until operation of the BR block 310 is triggered. BR block 310 also delivers vbg signal, the bandgap reference voltage. Only when bgstart reaches a given voltage level, i.e., once BR block 310 is triggered and vbg is generated, does bgbias become asserted.

Schmidt trigger 312 squares the signal bgstart in order to minimize rise time and outputs the signal refready. Refready is applied to AND gate 314. The other input of AND gate 314 is ponbl(bar). Ponbl(bar) senses the charge on capacitor 326 through Schmitt trigger 328. Schmitt trigger 328 outputs the opposite of the value of the voltage it senses. Thus, Schmitt trigger 328 is at logic "1" at the beginning of the operation, since capacitor 326 is discharged at the onset of the power up. Preferably, the trigger value of Schmidt trigger 328 is set at Vcc minus a few tenths of a volt, for example, 0.3V in the case of a low voltage flash memory. AND gate 314 outputs the signal por_pump_enable which is applied to activate POR Pump 316, described further below.

Referring now to transistors or switches 318, 320 and 324, and capacitor 326, these components together make up a switching circuit that charges capacitor 326 to Vcc but only after certain conditions in the flash memory circuit have been met, as will be explained. In order to charge capacitor 326, it is necessary that all three transistors 318, 320 and 324 be turned on. Preferably transistors 320 and 324 will be n-channel devices-channel devices, while transistor 318 will be a p-channel device. Transistor 318 is turned on by bgbias. As noted, bgbias mirrors the current generated internally in BR 310, hence it is asserted only when BR 310 is activated. Transistor 318 functions to insure that capacitor 326 does not charge until BR 310 is activated. Monitoring bgbias alone, however, is not sufficient to ensure proper operation of the POR. If, for example, Vcc does not reach the $Vcc_{min}$ specified for chip operation (for example, 1.65V in the case of a very low voltage flash memory), but reaches a value less than Vccmin that is still sufficient to trigger BR 310 (for example, Vcc minus a few tenths of a volt), transistor 318 will still turn on, though perhaps not completely, and capacitor 326 will start to charge. Thus, transistors 320 and 324 only turn on after other circuit conditions required for proper operation have been met, as will be explained.

Pump 338 is a high efficiency pump used in the flash memory to generate the vread signal. Its operation will be familiar to those of ordinary skill in the art. The vread voltage value is around 5V. The vread signal is applied to the flash memory array (not shown) to read the flash memory cells in the array. It is most important to flash memory operation that vread be at the proper value since incorrect memory reading may otherwise occur. Pump 338 is regulated to its nominal value by a feedback loop including a capacitive voltage divider that includes capacitors 340 and 342, differential sensing device 336 and AND gate 334. The output vbg of the BR 310 is applied to the positive input of differential sensing device 336. The other input of differential sensing device 336 is taken from capacitive voltage divider of capacitors 340 and 342.

In normal steady state operation after completion of the power up, if for any reason vread is reduced in value, the output of differential sensing device 336, comp_lp_out, goes to logic "1." Comp_lp_out is input to AND gate 334. The other input to AND gate 334 is refready, the output of Schmitt trigger 312, and is already at "1." In other words, the output of AND gate 334, Pump_enable(bar) goes to "1" whenever comp_lp_out goes to logic "1" and BR block 310 is powered up. Pump_enable(bar) is fed back to enable pump 338 to allow more clock pulses to enter the Pump 338 thus increasing (and controlling) the output of pump 338, vread. Before BR block 310 is triggered and refready (vbg) goes to "1", comp_lp_out is at logic "1" following the Vcc ramp. However, pump_enable(bar) cannot go to "1" at this time, because refready is not yet active. Hence the Pump 338 cannot be activated. Only after the BR block 310 is switched on, vbg and refready are present, and pump_enable(bar) is at "1," can Pump 338 start ramping to generate vread. In other words, the AND gate 334 insures that Pump 338 is quiet until BR block 310 is triggered. As a consequence, vread will start to ramp only after refready is at "1".

The signal vread is the second signal gating the charging circuit of capacitor 326 via transistor 324. This signal alone would not be sufficient for correct POR operation. In fact, vread may reach an intermediate voltage able to turn on transistor 324 when Vcc is still less than Vccmin. The gating action of transistor 324 increases the safety of the POR. If vread is not present, transistor 324 cannot be turned on and capacitor 326 cannot be charged.

The POR Pump 316 delivers the third signal needed to charge capacitor 326. The POR Pump 316 is preferably a low-efficiency pump made by a simple standard voltage multiplier, where no attempt is made to compensate it for the natural loss of one Vt to start operation, typical of such circuits. No output at all is generated until Vcc is greater than at least one Vt of the n-channel transistors used in the pump. This introduces a delay in the output of POR Pump 316, por_pump_out, insuring that transistor 320 is turned on only after a given delay due to the inefficiency of the pump. Although a logic delay circuit could be used, it should be noted that the delay provided by a pump such as POR pump 316 is preferable because transistor 320 should be driven by a voltage well above Vcc to insure that the voltage drop across transistor 320 is held to a minimum so that capacitor 326 is charged to the full value of Vcc.

In summary, the following conditions at least are met for power-on reset transition to occur:

1. BR block 310 is triggered thus switching on transistor 318;
2. vread reaches a voltage at least higher than one Vt of the n-channel transistor 324;

3. Vcc reaches a voltage at least one Vt higher than the turn on of an n-channel transistor before capacitor 326 slowly starts to be charged.

4. Once the voltage on capacitor 326, vc, reaches the threshold of Schmidt trigger 328, set typically at Vcc–0.3 V, the Schmidt trigger output ponbl/bar) goes to "0". This is still not sufficient to generate a useful transition ("1" to "0") of the rst signal, which is ramping along with Vcc at logic "1", thereby resetting all the flash memory. In order to get rst to "0", which actually enables the memory for operation, ponbl(bar) must be latched into D-latch 330, by the output of inverter 332, clk when it reaches "1". This condition happens only when the output of a differential sensing device such as differential sensing device 336, comp_lp_out, goes to "0", i.e. after vread has reached the nominal regulated value, as determined by vbg and by the capacitive voltage divider of capacitor 340 and 342. The capacitive voltage divider is, of course, necessary to reduce vread to match the nominal voltage of vbg, the other input to differential sensing device 336. If, for any reason, clk should arrive before ponbl(bar), rst will be transitioned to "0" by ponbl(bar) and not by clk. In other word, the transition to "0" of rst is determined by ponbl(bar) or by clk, whichever occurs last. In either case, rst is reset to the logic level "0" only after Vcc has reached at least a minimum value first to trigger BR 310, then to activate POR pump 316 and Vread has reached its nominal value. Thus, the POR reset circuit of the present invention insures proper start up of the memory after the power up.

Figure 4:
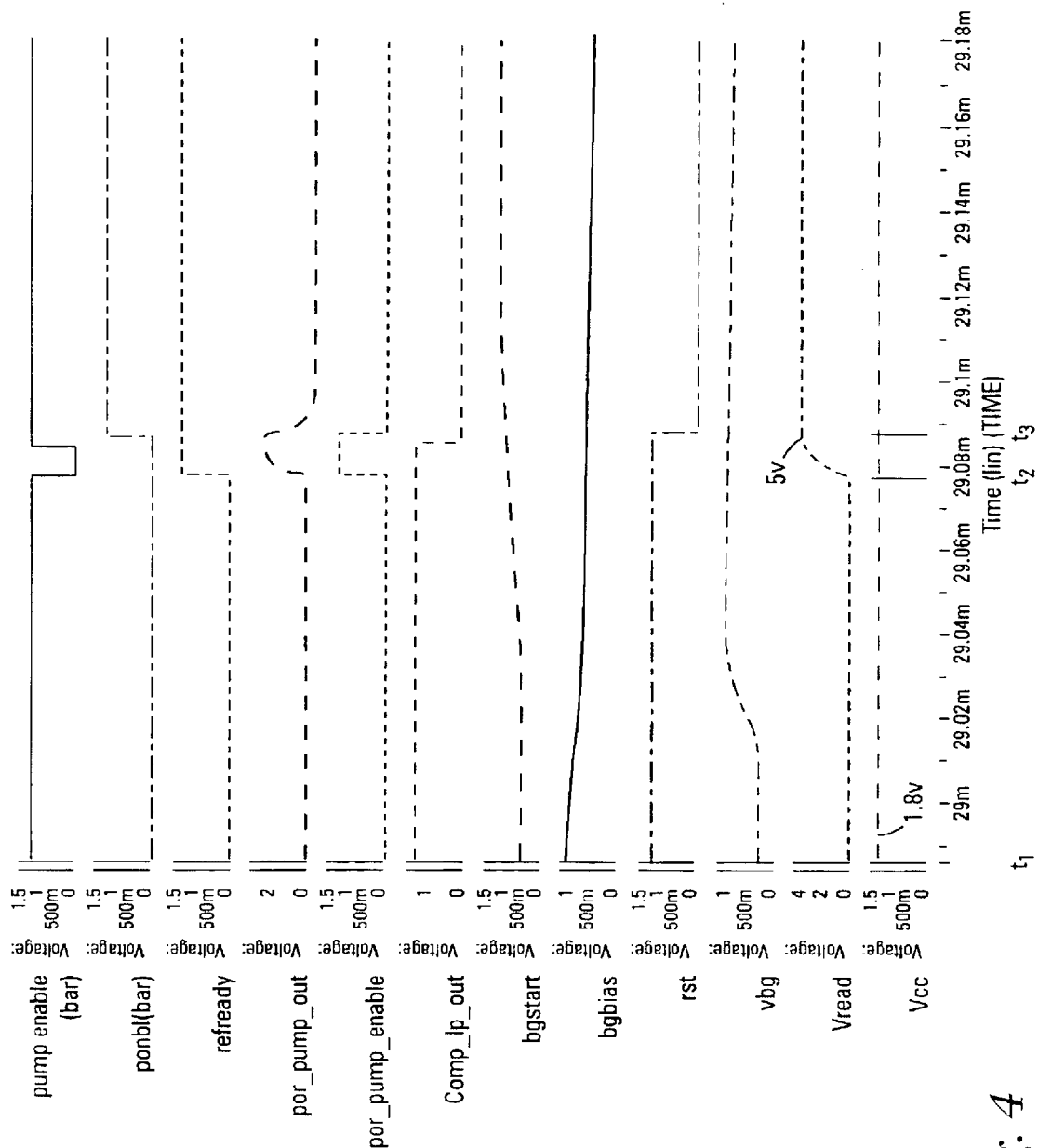
FIG. 4 is a timing diagram of the operation of a circuit according to an embodiment of the invention, showing voltage waveforms from the moment that Vcc ramps to a level sufficient to activate the voltage reference block until the power-on reset signal has been transitioned to "0."

FIG. 4 shows an example of a timing diagram illustrating the sequence of voltage waveforms of the circuit operation just described. At $t_1$ Vcc has already ramped to a level sufficient to activate BR block 310 (about 1.8 V) and vbg and bgstart ramp. After bgstart reaches a level sufficient to trigger refready from Schmitt trigger 312 at $t_2$, pump_enable (bar) transitions and vread rises in response. Por_pump_enable then can transition in response to refready and por_pmp_out rises. As can be seen, at this time por_pump_out, vread and bgbias are all at levels sufficient to turn on series connected transistors 318, 322 and 324, thus allowing capacitor 326 to charge to Vcc. At about $t_3$, vread has reached its nominal value and comp_lp_out and pump_enable(bar) will transition. After the voltage on capacitor 326 has reached a level sufficient to trigger Schmitt trigger 328, ponl(bar) will transition and will be latched into latch 330 by comp_lp_out (bar) and rst will go to zero.

In order to avoid unnecessary power consumption, after the transition from "1" to "0" of rst, once ponbl(bar) goes to "0", POR Pump 316 is no longer enabled (since the output of Schmitt Trigger 328 will be "0" and the output por_pump_enable of the AND gate 214 will go to "0". The Ponbl(bar) signal is also used to turn on the p-channel transistor 322, which bypasses transistor 320 in keeping capacitor 326 charged to Vcc, thus effectively latching ponbl(bar) to "0". Since the POR Pump 316 is no longer enabled it will not draw any more current while POR pump_out goes slowly to With respect to other POR circuits that work only in a given range of Vcc ramp, those of ordinary skill in the art will recognize that the POR circuit of the present invention is robust enough to work properly with different slopes of the Vcc ramp, and with Vccmin as low as, for example, 1.4V.

CONCLUSION

A POR reset circuit is disclosed. One embodiment includes a sensing circuit that determines when integrated circuit voltages and/or currents have reached predetermined levels and provides at least one trigger signal in response thereto, a delay circuit that introduces a delay in at least one of the trigger signals to provide time for selected voltages of the integrated circuit to reach nominal values before a POR reset signal transition takes place, a switching circuit that switches in response to signals including trigger signals from the sensing circuit and the delay circuit and generates a signal for operating a power-on reset signal. In another aspect of the present invention, the POR reset circuit includes a power saver latch that deactivates current consuming components of the POR circuit after the power-on reset signal transition has taken place.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A power-on reset circuit for an integrated circuit comprising:
   a sensing circuit to determine when selected voltages and/or currents have reached predetermined levels and to provide at least a first trigger signal and a second trigger signal in response thereto, wherein the second trigger signal is asserted only after the first trigger signal reaches a predetermined voltage level;
   a delay circuit coupled to receive the first trigger signal and to provide a delayed trigger signal in response thereto; and
   a switching circuit to provide a reset signal in response to at least the second trigger signal and the delayed trigger signal.

2. The power-on reset circuit of claim 1 wherein the sensing circuit is coupled to receive a plurality of voltage reference signals.

3. The power-on reset circuit of claim 1 wherein the sensing circuit comprises a Schmitt trigger to shape a slope of the first trigger signal.

4. The power-on reset circuit of claim 1 wherein the sensing circuit comprises a differential sensing device to compare a memory read signal and a voltage reference input signal.

5. A power-on reset circuit for an integrated circuit comprising:
   a sensing circuit to determine when selected voltages and/or currents have reached predetermined levels and to provide a trigger signal in response thereto;
   a delay circuit coupled to an output of the sensing circuit to provide a delayed trigger signal, wherein the delay circuit comprises a power-on reset pump; and
   a switching circuit to provide a reset signal in response to the trigger signal and the delayed trigger signal.

6. The power-on reset circuit of claim 1 wherein the switching circuit comprises a capacitor selectively coupled to a supply voltage of the integrated circuit upon activation of a plurality of switches of the switching circuit.

7. A power-on reset circuit for an integrated circuit comprising;
   a sensing circuit to determine when selected voltages and/or currents have reached predetermined levels and to provide a trigger signal in response thereto;
   a delay circuit coupled to the sensing circuit to provide a delayed trigger signal; and a switching circuit to provide a reset signal in response to the trigger signal and the delayed trigger signal, wherein the switching circuit comprises a latch;

wherein the latch is operatively coupled to an output of a differential sensing device.

8. The power-on reset circuit of claim 6 wherein the capacitor is selectively coupled in response to a signal from the sensing circuit signaling that a memory read voltage has reached a predetermined level.

9. A power-on reset circuit comprising a reference voltage circuit; and a reset output circuit enabled to monitor a supply voltage in response to signals generated by the reference voltage circuit and to provide a reset signal when the supply voltage reaches a predetermined level;

wherein the reset output circuit comprises a capacitor selectively coupled to the supply voltage in response to signals provided by the reference voltage circuit;

wherein the capacitor is selectively coupled to the supply voltage by a plurality of series coupled transistors activated by signals comprising signals provided by the reference voltage circuit; and wherein at least one of the series coupled transistors is an n-channel transistor and the gate voltage provided to the at least one n-channel transistor is greater than the supply voltage.

10. A system comprising:

a memory coupled to a processor and a power supply, and a memory power-on reset circuit comprising:

a sensing circuit to determine when selected system voltages and/or currents have reached predetermined levels and to provide at least a first trigger signal and a second trigger signal in response thereto, wherein the second trigger signal is asserted only after the first trigger signal reaches a predetermined voltage level;

a delay circuit coupled to receive the first trigger signal and to provide a delayed trigger signal; and a switching circuit to provide a power-on reset signal in response to at least the second trigger signal and the delayed trigger signal.

11. The system of claim 10 wherein the sensing circuit is coupled to receive a plurality of voltage reference signals.

12. The system of claim 10 wherein the sensing circuit comprises a Schmitt trigger to shape a slope of at least one voltage reference input signal.

13. The system of claim 10 wherein the sensing circuit comprises a differential sensing device to compare a signal coupled to a memory read signal and a voltage reference input signal.

14. A system comprising:

a memory coupled to a processor and a power supply, and a memory power-on reset circuit comprising:

a sensing circuit to determine when selected system voltages and/or currents have reached predetermined levels and to provide a trigger signal in response thereto;

a delay circuit coupled to an output of the sensing circuit to provide a delayed trigger signal; and a switching circuit to provide a power-on reset signal in response to the trigger signal and the delayed trigger signal;

wherein the delay circuit comprises a power-on reset pump.

15. The system of claim 10 wherein the switching circuit comprises a capacitor selectively coupled to a supply voltage of the integrated circuit upon activation of a plurality of switches of the switching circuit.

16. A system comprising:

a memory coupled to a processor and a power supply, and a memory power-on reset circuit comprising:

a sensing circuit to determine when selected system voltages and/or currents have reached predetermined levels and to provide a trigger signal in response thereto;

a delay circuit coupled to an output of the sensing circuit to provide a delayed trigger signal; and a switching circuit to provide a power-on reset signal in response to the trigger signal and the delayed trigger signal;

wherein the delay circuit comprises a power-on reset pump; and wherein the pump is deactivated after the reset signal has been provided.

17. A system comprising:

a memory coupled to a processor and a power supply, and a memory power-on reset circuit comprising:

a sensing circuit to determine when selected system voltages and/or currents have reached predetermined levels and to provide a trigger signal in response thereto;

a delay circuit coupled to the sensing circuit to provide a delayed trigger signal; and a switching circuit to provide a power-on reset signal in response to the trigger signal and the delayed trigger signal;

wherein the switching circuit comprises a latch and wherein the latch is operatively coupled to an output of a differential sensing device.

18. The system of claim 10 wherein the switching circuit further comprises a capacitor selectively coupled to the supply voltage.

19. The system of claim 18 wherein the capacitor is selectively coupled to the supply voltage by a plurality of series coupled transistors.

20. A system comprising:

a memory coupled to a processor and a power supply, and a memory power-on reset circuit comprising:

a sensing circuit to determine when selected system voltages and/or currents have reached predetermined levels and to provide a trigger signal in response thereto;

a delay circuit coupled to an output of the sensing circuit to provide a delayed trigger signal; and a switching circuit to provide a power-on reset signal in response to the trigger signal and the delayed trigger signal;

wherein the switching circuit is enabled by a pump.

21. A method for providing a power-on reset (POR) signal to an integrated circuit, the method comprising:

sensing when selected integrated circuit voltages and/or currents have reached predetermined levels;

providing at least a first trigger signal and a second trigger signal in response to sensing when selected integrated circuit voltages and/or currents have reached predetermined levels, wherein the second trigger signal is only asserted after the first trigger signal reaches a predetermined level;

delaying at least the first trigger signal, thereby generating a delayed trigger signal;

switching a signal for transitioning a power-on reset signal in response to signals comprising at least the second trigger signal and the delayed trigger signal, whereby integrated circuit voltages and/or currents can reach predetermined values before a POR reset signal transition takes place.

22. The method of claim 21 further comprising deactivating a power consuming element operating the power-on reset signal after the power-on reset signal has transitioned.

23. The method of claim 21 wherein switching a signal for transitioning a power-on reset signal in response to signals comprising at least the second trigger signal and the delayed trigger signal further comprises switching the power-on reset signal in response to a signal indicating that a memory read signal has reached a predetermined value.

24. A method for providing a power-on reset (POR) signal to an integrated circuit, the method comprising:
   sensing when selected integrated circuit voltages and/or currents have reached predetermined levels;
   providing at least one trigger signal in response to sensing when selected integrated circuit voltages and/or currents have reached predetermined levels;
   delaying at least one of the at least one trigger signals; and
   switching a signal for transitioning a power-on reset signal in response to signals comprising the at least one trigger signal;
   whereby integrated circuit voltages and/or currents can reach predetermined values before a POR reset signal transition takes place; and
   wherein delaying a trigger signal to provide time for integrated circuit voltages to reach at least nominal values comprises operating a pump.

25. A memory circuit comprising a power-on reset circuit, comprising:
   a sensing circuit, to determine when memory circuit voltages and/or currents have reached predetermined levels and to provide at least one trigger signal in response thereto;
   a delay circuit to introduce a delay in at least one of the trigger signals, wherein the delay circuit comprises a power-on reset pump;
   a switching circuit to switch in response to signals comprising trigger signals from the sensing circuit and the delay circuit and to generate a power-on reset signal.

26. A method for providing a power-on reset (POR) signal to an integrated circuit, the method comprising:
   measuring a supply voltage of the integrated circuit by a capacitor that charges in response to a switching circuit activated by signals comprising:
      a first signal from a voltage reference source;
      a second signal from a memory read voltage source;
      a third signal from a pump that is activated by one or more signals comprising a signal from the voltage reference source,
   whereby the POR reset signal transitions only after the voltage on the capacitor has reached a predetermined level.

27. The method for providing a power-on reset signal to an integrated circuit of claim 26 comprising sensing a voltage on the capacitor with a triggering device.

28. The method for providing a power-on reset signal to an integrated circuit of claim 27 comprising supplying the output of the triggering device as a signal to activate a pump.

29. The method for providing a power-on reset signal to an integrated circuit of claim 28 further comprising supplying the output of the triggering device as a signal to bypass a switch operated by the pump after a power on reset signal transition has occurred.

30. The method for providing a power-on reset signal to an integrated circuit of claim 28 further comprising latching the output of the triggering device in response to a signal indicating when the second signal has reached a predetermined value.

31. The method for providing a power-on reset signal to an integrated circuit of claim 30 wherein the signal indicating when the second signal has reached a predetermined value is an output from a differential sensing device that determines when the second signal has reached a nominal value.

* * * * *